(12) United States Patent
Ryckaert et al.

(10) Patent No.: US 10,720,363 B2
(45) Date of Patent: Jul. 21, 2020

(54) METHOD OF FORMING VERTICAL TRANSISTOR DEVICE

(71) Applicants: IMEC VZW, Leuven (BE); Vrije Universiteit Brussel, Brussels (BE)

(72) Inventors: Julien Ryckaert, Schaerbeek (BE); Naoto Horiguchi, Leuven (BE); Dan Mocuta, Herent (BE); Trong Huynh Bao, Leuven (BE)

(73) Assignees: IMEC vzw, Leuven (BE); Vrije Universiteit Brussel, Brussels (BE)

( * ) Notice: Subject to any disclaimer, the term of this patent is extended or adjusted under 35 U.S.C. 154(b) by 84 days.

(21) Appl. No.: 15/977,381

(22) Filed: May 11, 2018

(65) Prior Publication Data

US 2018/0330997 A1 Nov. 15, 2018

(30) Foreign Application Priority Data

May 15, 2017 (EP) .................................. 17171133

(51) Int. Cl.
*H01L 21/8234* (2006.01)
*H01L 21/8238* (2006.01)
(Continued)

(52) U.S. Cl.
CPC ............. *H01L 21/823885* (2013.01); *H01L 21/28518* (2013.01); *H01L 21/308* (2013.01);
(Continued)

(58) Field of Classification Search
CPC .......... H01L 21/823885; H01L 29/785; H01L 29/78642; H01L 29/66666; H01L 21/308; H01L 29/45; H01L 29/0653; H01L 27/092; H01L 27/1104; H01L 23/528; H01L 21/76205; H01L 29/7827; H01L 21/30604;
(Continued)

(56) References Cited

U.S. PATENT DOCUMENTS 5,780,327 A 7/1998 Chu et al.
6,060,723 A 5/2000 Nakazato et al.
(Continued)

OTHER PUBLICATIONS

European Search Report dated Nov. 27, 2017 in European Application No. 17171133.6; 8 pages.

*Primary Examiner* — Latanya N Crawford
(74) *Attorney, Agent, or Firm* — Knobbe, Martens, Olson & Bear, LLP

(57) ABSTRACT

The disclosed technology generally relates to semiconductor fabrication and more particularly to forming vertical transistor devices. In an aspect, a method of forming a vertical transistor device includes forming, on a substrate, a fin comprising a stack including a first layer, a second layer formed above the first layer and a third layer formed above the second layer. The method additionally includes forming a gate layer serving as an etch mask above the third layer. The method further includes etching the second and third layers of the fin using the gate layer as the etch mask to form a pillar. First and third layers of the pillar define a source region and a drain region, respectively, of the vertical transistor device. A second layer of the pillar defines a channel region of the vertical transistor device. The gate layer comprises a gate electrode arranged on at least one sidewall of the second layer.

19 Claims, 7 Drawing Sheets

(51) Int. Cl.
*H01L 21/285* (2006.01)
*H01L 21/306* (2006.01)
*H01L 29/78* (2006.01)
*H01L 21/762* (2006.01)
*H01L 23/528* (2006.01)
*H01L 27/11* (2006.01)
*H01L 27/092* (2006.01)
*H01L 29/06* (2006.01)
*H01L 29/45* (2006.01)
*H01L 21/308* (2006.01)
*H01L 29/66* (2006.01)
*H01L 29/786* (2006.01)

(52) U.S. Cl.
CPC .. *H01L 21/30604* (2013.01); *H01L 21/76205* (2013.01); *H01L 21/823814* (2013.01); *H01L 21/823871* (2013.01); *H01L 21/823878* (2013.01); *H01L 23/528* (2013.01); *H01L 27/092* (2013.01); *H01L 27/1104* (2013.01); *H01L 29/0653* (2013.01); *H01L 29/45* (2013.01); *H01L 29/66666* (2013.01); *H01L 29/785* (2013.01); *H01L 29/7827* (2013.01); *H01L 29/78642* (2013.01)

(58) Field of Classification Search
CPC ....... H01L 21/28518; H01L 21/823878; H01L 21/823871; H01L 21/823814; H01L 29/66795
See application file for complete search history.

(56) References Cited

U.S. PATENT DOCUMENTS

| | | | |
|---|---|---|---|
| 6,492,662 B2 * | 12/2002 | Hsu | H01L 21/84 257/124 |
| 7,683,428 B2 * | 3/2010 | Chidambarrao | H01L 29/66787 257/302 |
| 8,946,670 B1 | 2/2015 | Park | |
| 9,087,922 B2 * | 7/2015 | Sun | H01L 21/823487 |
| 9,461,054 B2 * | 10/2016 | Sun | H01L 21/823487 |
| 9,620,509 B1 | 4/2017 | Pao et al. | |
| 9,646,973 B2 * | 5/2017 | Liaw | H01L 27/1104 |
| 9,911,804 B1 * | 3/2018 | Mallela | H01L 29/66666 |
| 10,170,543 B2 * | 1/2019 | Mallela | H01L 29/66666 |
| 2003/0064567 A1 | 4/2003 | Chaudhry et al. | |
| 2009/0200604 A1 * | 8/2009 | Chidambarrao | H01L 29/66787 257/329 |
| 2011/0068418 A1 | 3/2011 | Lung | |
| 2012/0086066 A1 | 4/2012 | Kim et al. | |
| 2012/0319201 A1 * | 12/2012 | Sun | H01L 21/823487 257/338 |
| 2013/0113037 A1 * | 5/2013 | Masuoka | H01L 29/78 257/329 |
| 2015/0255619 A1 * | 9/2015 | Shimabukuro | H01L 29/78642 257/314 |
| 2015/0318393 A1 | 11/2015 | Masuoka et al. | |
| 2016/0284712 A1 * | 9/2016 | Liaw | H01L 27/1104 |
| 2018/0053821 A1 * | 2/2018 | Mallela | H01L 29/66666 |

* cited by examiner

METHOD OF FORMING VERTICAL TRANSISTOR DEVICE

CROSS-REFERENCE TO RELATED APPLICATIONS

This application claims foreign priority to European Patent Application No. 17171133.6, filed May 15, 2017, the content of which is incorporated by reference herein in its entirety.

BACKGROUND

Field

The disclosed technology generally relates to semiconductor fabrication and more particularly to forming vertical transistor devices.

Description of the Related Technology

There is a general objective by semiconductor industry to scale integrated circuit (IC) devices to smaller feature sizes with reduced area occupied by the devices, e.g., an area occupied by a transistor, and a corresponding increase in circuit density.

One approach to scaling involves vertical transistors, which can provide an even smaller layout area compared to some planar transistor-based designs. One type of transistor that can enable present and future scaling of IC devices is transistors with nanowire-based channels, such as vertical nanowire field effect transistors (FETs). In vertical nanowire FETs, due to the vertically oriented channel structure, the lateral footprint occupied by the gate length does not scale with a linewidth of the gate but instead scales with gate thickness. Such transistors allow, among other things, reduced gate lengths while reducing issues associated with short channel effects that may be observed in planar devices at a comparable technology node.

Further, the source and drain regions of a vertical transistor device are vertically displaced in relation to each other. For these reasons, among others, vertical transistor devices enable dense device integrations. However, the manufacturing of vertical transistors (in ICS) tends to be a quite complex and expensive process.

Thus, there is a need for improved methods for making such transistor devices.

SUMMARY OF CERTAIN INVENTIVE ASPECTS

An objective of the present inventive concept is to provide an improved method for forming pillars that can be used to form a vertical transistor device. Further and alternative objectives may be understood from the following.

According to an aspect of the present inventive concept there is provided a method for forming pillars in a vertical transistor device, comprising: providing, on a substrate, a fin formed by a stack of a first layer, a second layer and a third layer, wherein the second layer is positioned above the first layer and the third layer is positioned above the second layer; providing a gate layer forming an etch mask arranged above the third layer; and etching at least the second and third layer through the etch mask to form a pillar of the fin, wherein: the first and third layers of the pillar defines a source and drain region, respectively, of the transistor device, the second layer of the pillar defines a channel region of said transistor device, and the gate layer further comprises a gate electrode arranged on at least one sidewall of the second layer.

The disclosed technology advantageously enables a method wherein an etch mask also serves as a gate electrode (or gate template). This is achieved by providing a gate layer that comprises both the etch mask structure and the gate electrode structure, and wherein the same layer thus may act both as an etch mask for patterning the fin into pillars and as a gate electrode for contacting the channel region of the transistor device formed of the fin. Is should be noted that the term "gate electrode," or "gate layer," as used herein may refer both to the final gate electrode structure of the transistor device and to a replacement structure or template temporarily used for defining the final gate electrode during the manufacturing process. For ease of readability, however, the term "gate electrode" or "gate layer" is used when discussing the presently disclosed technology. The gate layer may thus be provided in the form of, e.g., an electrically conductive material that is deposited on the vertical sidewalls of the fins (to form the gate electrode) and above the fins (to form the etch mask). The gate layer may thereafter be patterned to form the etch mask defining the pillar structure into which the fin is to be formed. This combined use of the gate layer as a pillar etch mask and a gate electrode allows for a self-alignment of the gate electrode with respect to the pillar structure, which simplifies and improves the processing of the vertical transistor devices.

Advantageously, the combined use of the gate layer may reduce the number of processing steps when forming the fin into a transistor device. The method may, advantageously, be applied for forming circuitry including, e.g., cross-coupled complementary metal oxide semiconductor (CMOS) devices, e.g., static random access memory (SRAM) devices or logic cells. However, embodiments are not so limited and the method may be applied to form various other logic and memory devices.

In the context of the present application, the term "gate layer" or "gate level" may thus refer to a structure including conductive paths that may extend on the sidewalls of the fin, between the fins an on or above the fins.

As described herein, orientations of various structures may be referenced relative to a major surface of the substrate on which the structures are formed. For example, a vertically extending fin refers to a fin structures that are elongated and extend in a direction substantially perpendicular to the major surface. However, it will be appreciated that two directions that cross each other are not limited to perpendicular directions.

The gate layer may further include an electrically insulating material or a dielectric separating the conductive features of the gate layer from each other. Thus, it will be appreciated that the term "layer" or "level" is not restricted to a planar structure or conductive material. On the contrary, it may comprise feature extending in different vertical levels and which are electrically isolated from each other. The portions of the gate layer arranged on the sidewall(s) of the second layer of the fin may form the gate electrode, whereas the portions of the gate layer arranged on or above the third layer of the fin may form the etch mask.

The gate layer may therefore be referred to described one or both of a gate electrode and an etch mask, depending on its function and the context. A "gate electrode," "gate contact" or "gate" may be understood as the portion of the gate layer that is arranged at the channel region, and by which the conductive state of the transistor device (at least in case the gate electrode is the final gate electrode and not a replacement gate) may be controlled. Thus, the gate electrode may refer to the part of the gate layer that is contacting the sidewall(s) of the second layer of the fin, i.e., the channel region of the transistor device formed by the fin. It will be appreciated that the gate electrode may be arranged only on one side of the fin, or on both sides.

Further, in case the fin has been formed into a pillar, the gate electrode may be arranged also on one or both of the remaining sidewalls of the pillar. In case the gate electrode is arranged to surround the pillar, the transistor device may be referred to as a gate-all-around transistor.

The term "channel" or "channel region" may be used to refer to the functional part of the transistor structure that is arranged between the source and drain region, and through which the current may flow when the transistor device is in its conducting state.

The fin may be understood as a feature which at least along a portion of its length may extend in a vertical direction. The direction of extension is often along a straight line. However, embodiments are not so limited and the direction of extension may not be along a straight line. The fin often has a substantially uniform width along its length direction. However, embodiments are not so limited and the width may vary, e.g., uniformly vary, along the length direction. For example, the width of the fin may decrease or increase, e.g., uniformly decrease or increase, along the length direction. The fin may, e.g., be formed by etching a stacked structure comprising a plurality of layers, such that the resulting fin is a multi-layered structure. The width of the fin, and the minimum distance between neighboring fins, may be defined using multiple patterning techniques, such as self-aligned double patterning (SADP) or quadruple patterning (SAQP).

The term "stack" of layers may be used to describe layers being arranged above or on top, of each other, e.g., in the vertical direction.

A reference to layer, a level or other element, being formed "above" a first feature such as a layer, a level or other element, may be used to describe that a second feature is formed above the first feature, e.g., along (or as seen) in the vertical direction.

The terms "vertical transistor" or "vertical transistor device" may be used to describe a transistor device where the source and the drain region are arranged in a vertical direction relative to each other. As the current flows in the vertical direction, the device may be considered to form a vertical transistor device.

According to an embodiment, the method may further comprise selective forming, prior to providing the gate layer, of a dielectric on the sidewalls of the first and third layers of the fin to electrically isolate the source and the drain region from the gate layer. The selective deposition of the dielectric hence allows for a self-alignment of the gate electrode at the channel region, which simplifies the processing of the device.

As described herein, "selectively forming" may refer to a process which results in a material or a layer, e.g., a dielectric, being formed on one surface but not the other. For example, a material or a layer may be selectively formed on sidewalls of a first and/or a third layer, but not on a second layer of a fin. Thus, the resulting structure allows for the channel region to be contacted by the subsequently added gate layer, while the source and drain regions remain electrically isolated from the gate layer. The selective forming may be performed in a single process, or by means of a plurality of processing steps. Different exemplifying embodiments will be discussed in further detail in the following.

The selectivity of the deposition of the dielectric may, e.g., be achieved by forming the sidewall of the second layer of a material that is less prone to form (or receive or build up) a dielectric compared to the material of the sidewalls of the other layers. This may, e.g., be done by combining two materials having a different rate of oxidation, such that the material of the first and third layers under certain conditions may form a much thicker oxide layer than the material of the second layer. Accordingly, the conditions, such as, e.g., environmental or process parameters relating to temperature and pressure during the oxide forming process, may be selected to change, e.g., increase, the ratio between the rate of the oxidation of the first and third layers compared to the rate of the oxidation of the second layer of the fin.

Further, it is appreciated that in case some dielectric material is deposited also on the sidewalls of the second layer, it may be removed in a subsequent processing step. The removal may be selective, such that the dielectric is removed from the second layer but not the first and third layers, or a uniform removal. In case the removal is uniform, the dielectric may form a thicker layer at the first and third layers so as to allow at least some dielectric to remain on the first and third layers after removal of the dielectric from the second layer.

Thus, according to an embodiment, the dielectric may be formed by oxidizing the first, second and third layer at a temperature and pressure selected such that a thicker dielectric is provided on the first and third layers than on the second layer, and thereafter etching the dielectric to expose the sidewall of the second layer such that at least some of the dielectric remains on the first and third layer. In order to remove the dielectric that has been formed on the sidewall of the second layer, even though at much lower rate, a subsequent step of etching the dielectric to expose the sidewall of the second layer may be added, such that at least some of the dielectric remains on the first and third layers to isolate the source and drain regions from the gate layer.

The dielectric may hence refer to an oxide. Thus, at a specific temperature and/or pressure the different materials of the layers may oxidize at different speed. By selecting the temperature and/or pressure such that the dielectric is formed at a higher rate on the first and third layers than on the second layer, the dielectric is getting different thicknesses on the sidewalls.

For example, the second layer may have formed thereon no or a very thin layer of the dielectric, while the first and third layers may have formed thereon a thick layer compared to the second layer. Achieving these different thicknesses may be seen as a selective deposition. In one example, the first and the third layers may have a lower silicon content compared to the second layer. For example, the first and third layers be formed of silicon germanium, SiGe and the second layer may be formed of silicon, Si. Hence, the SiGe may oxidize at a different speed compared to the Si layer for a given temperature and/or pressure.

Alternative, or additional examples of selectively forming the dielectric may be to functionalize (or prepare) the surface of the layers such that the dielectric is growing faster on sidewall surface(s) of the first and third layers compared to the sidewall surface(s) of the second layer. Examples of functionalization may include atomic layer deposition (ALD) to enhance deposition on the sidewall surfaces of the first and third layers, or ALD or chemical vapor deposition (CVD) to inhibit nucleation of the sidewall surface of the second layer. Other examples of functionalization of the sidewall surfaces of the fins may be to make use of hydrophilic —H bonds and hydrophobic —O—H bonds to achieve a selectivity in the forming of the dielectric.

In an embodiment, the etch mask may comprise a gate line being orthogonal to the fin. Thus, the etch mask may be formed of one or several gate line(s) that may extend across the fin such that one or several pillars may be formed in the intersection between the fin and the gate line.

According to an embodiment, at least two parallel fins may be provided. Further, the gate layer may comprise at least three parallel gate lines, wherein each gate line may be isolated from the other and extend over both fins in an orthogonal direction relative the at least two fins.

Thus, the fins may be parallel, wherein the gate layer may be formed of parallel gate lines extending orthogonal to the fins. Each gate line may follow the contour of the fins, e.g., being arranged above, along the sidewalls of the fins and extending between neighboring fins. The intersection between a gate line and a fin may define the location of a transistor device, which hence may be formed in the vertical region below the intersection. The vertical region may in other words be understood as a vertically extending portion of the fin.

According to an embodiment, each fin may comprise a first vertical region for forming a N-type transistor device, and a second vertical region for forming a P-type transistor device. This allows for the fins to be formed into different types of logical components, such as logic cells, inverters and memory bit cells requiring different combinations of transistor types. The vertical regions may comprise a stacked structure formed of the first, second and third layer, wherein the first and third layers may be N-doped or P-doped and the second layer P-doped, N-doped or not doped at all, depending on the type of transistor to be formed. In some examples, the vertical region may form an NMOS transistor, in which the source/drain regions may be highly n-doped (N++) and the channel region lightly doped (P, intrinsic or N) or not doped at all. Accordingly, the vertical region may form a PMOS transistor, in which the source/drain regions may be highly p-doped (P++) whereas the channel region may have the same doping as the channel region of the NMOS transistor.

Each fins may be formed into several pillars, each forming a transistor device, by means of the etch mask arranged above the fins. The etching may, e.g., be performed only through the third and second layer, such that the material of the first layer remains between the vertical regions of the fin, thereby forming a bottom electrode. Alternatively, the etching may be performed also through the first layer so as to separate the transistors from each other (i.e., separating the source/drain regions of the neighboring transistors). The term "pillar" may hence be understood as an upright structure or post, which may be formed as the pattern of the etch mask is etched into at least some layers of the fin.

According to an embodiment, a first one of the fins may be formed into a first transistor device, a second transistor device and a third transistor device, whereas a second one of the fins may be formed into a fourth transistor device, a fifth transistor device and a sixth transistor device. Each one of the fins may comprise a transistor pair comprising a P-type and N-type transistor device. Thus, it will be appreciated that each fin may be formed into, e.g., two N-type transistor devices and one P-type transistor device, or one N-type transistor device and two P-type transistor devices, allowing logic components to be formed. By cutting only the two upper layers of the fin, two transistor devices may be formed, which share the bottom layer such that the source of a first one of the transistors is shared with the drain of the second one of the transistors. This structure, in which, e.g., a P-type transistor and an N-type transistor share source/drain regions via the first layer, may be used to form, e.g., an inverter.

According to one embodiment, the gate lines may be interrupted in between the fins such that the gates of the transistor devices in the first fin are isolated from the gate of the transistor devices in the second fin.

In one embodiment, the transistor devices of each of the fins may be connected to their neighboring transistor device by a drain connection formed by the first layer of that fin, or by cutting the first layer to separate the transistor devices from each other and then re-grow the first layer to form a bottom electrode. In this way the first layer may be used both for interconnecting the transistor devices and for forming the drain regions, which allows of an efficient layout. This formation may, e.g., facilitate the integration of the devices in the memory array of an SRAM cell.

In the context of the present application, "neighboring transistor devices" may refer to transistor devices of the same fin.

In one embodiment, the first layer may be silicided in the region of the first layer of each fin after the source/drain regions have the proper doping type, so as to form the drain connection between two neighboring transistors. In this way, the silicidation of the PN junctions may reduce the access resistance to the source/drain regions.

In one embodiment, the gates of the transistor pair of each fin may be electrically connected to each other and to the drain connection of the transistor pair in the other. This allows for the formation of an SRAM cell, in which the electrical connections may be formed at least in the region between the two parallel fins. By this arrangement of the electrical connections a more compact design of the SRAM cell may be achieved.

In one embodiment, the electrical connection to the drain connection may extend beyond the region in between the two parallel fins. This allows for the bottom electrode (i.e., the portion of the first layer arranged between two pillars) to be contacted on the highly doped (and possibly silicided) region of the first layer on either side of the pillar forming the transistor device.

In one embodiment, the SRAM cell may further have an electrical connection for a bit-line (BL) and word-line (WL), which may be connected to the respective gate of the remaining transistors devices (i.e., the transistor devices not included in the pair of transistor devices) of each of the fins.

These electrical connections may be formed at least in the region between the two parallel fins so as to allow for a compact design. In this way, the SRAM cell may be electrically connected to the WL for controlling access to the cell during read and write operations. In case the gate electrode is provided on both sidewalls of the fins forming the pillar, the gate may be accessed from either side of the fin.

As already mentioned, the term "remaining transistors" may hereby mean the transistors that are not included in the transistor pair that is electrically connected to the drain connection of the other fin.

In one embodiment, the second layer may be formed of silicon (Si) and the first layer and the third layer may be formed of silicon-germanium (SiGe). Alternatively, the second layer may be formed of SiGe and the first layer and the third layer formed of Si. The materials, such as, e.g., Si and SiGe as mentioned herein, may be doped during the formation of each layer (e.g. in the form of impurities added during epitaxial growth) or after a layer has been formed (e.g. by means of ion implantation).

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

FIG. 6b and FIG. 7b are cross sectional views of the fin structure illustrated in FIGS. 6a and 7a.

DETAILED DESCRIPTION OF CERTAIN ILLUSTRATIVE EMBODIMENTS

A method for defining a transistor device from a fin structure will now be described with reference to FIGS. 1-8.

Figure 1:
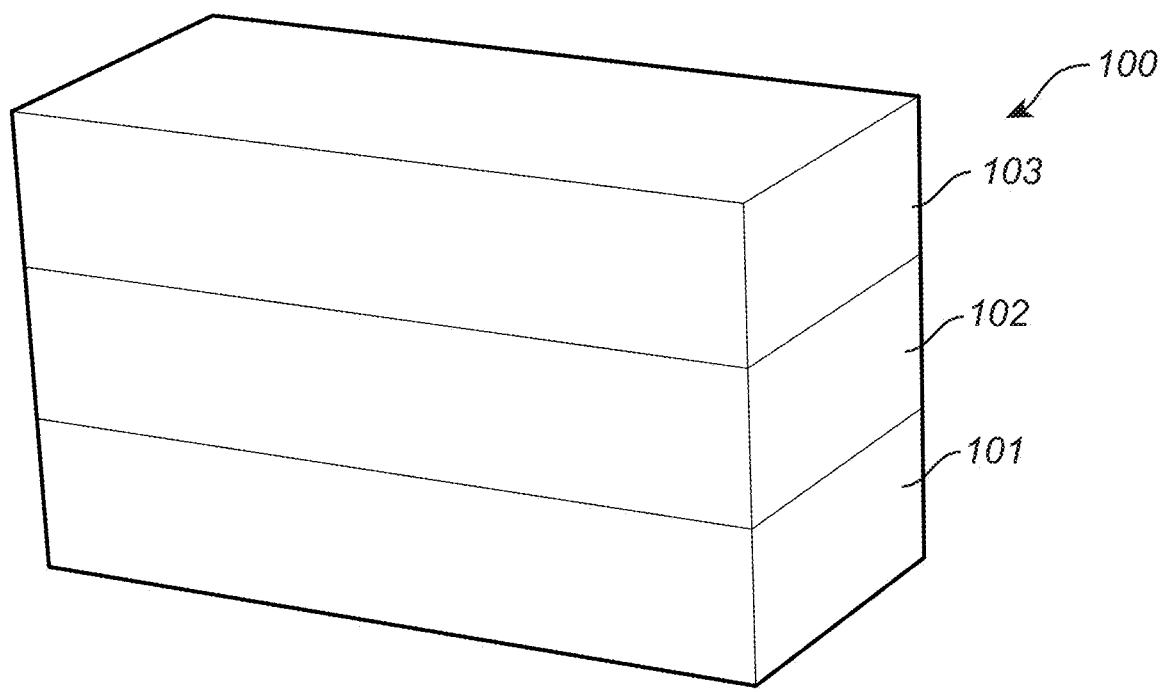
FIGS. 1-4 schematically illustrate a method for forming a plurality of fins according to an embodiment of the disclosed technology.

In FIG. 1, a perspective view of a stacked structure 100 is disclosed. The stacked structure 100 comprises a plurality of layers, e.g., a first layer 101, a second layer 102 and a third layer 103 as in the illustrated embodiment. The first layer may be arranged at the bottom of the layers, whereas the second layer may be positioned above the first layer and the third layer may be positioned at the top of the layers or above the second layer. The stacked structure 100 may be arranged on a semiconductor substrate (not shown in the figures). When forming a vertical transistor device, the source region may be defined by the first layer, the channel region defined by the second layer and the drain region defined by the third layer. However, it will be appreciated that the relative positions of the source region and the drain region may be interchanged.

The material of the first and third layers may be formed of, e.g., silicon-germanium (SiGe). The second material may be different to the first and second material, e.g., silicon (Si). When the first and third layers comprise SiGe and the second layer comprises Si, the resulting device may advantageously have a strained channel.

Figure 2:
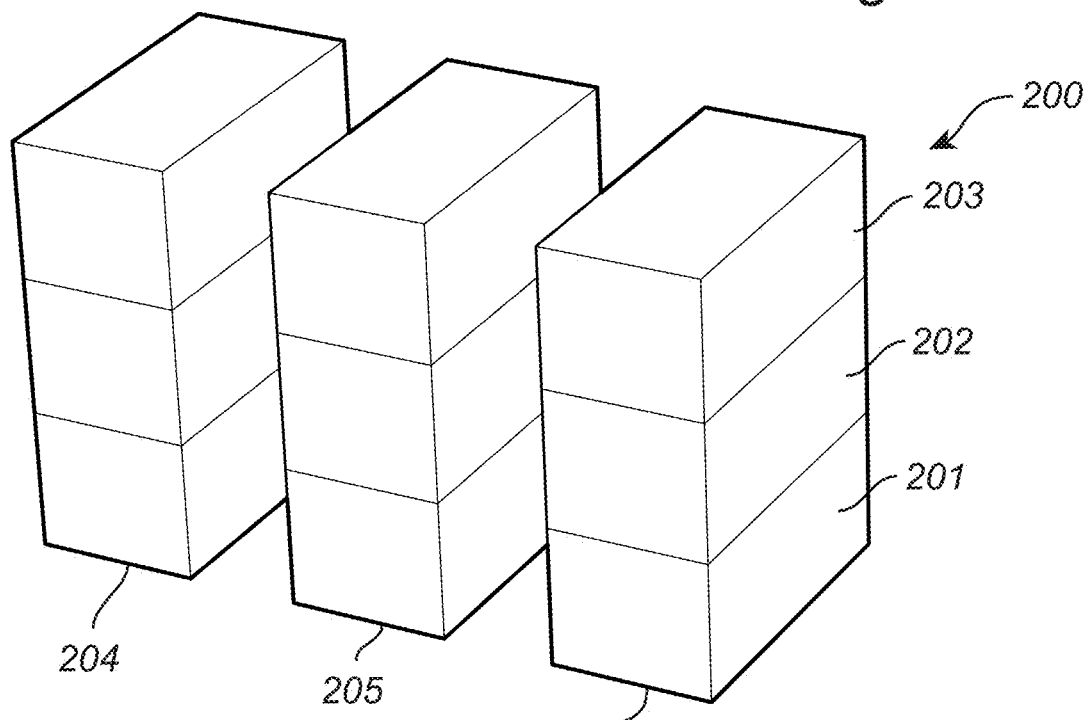

FIG. 2 shows a perspective view of multiple fin structures 200, which may be formed by further processing a stacked structure similar to the structure described in connection with FIG. 1 above. For example, the stacked structure may be etched in the vertical direction to form three fins, e.g., three parallel fins 204, 205, 206, where each fin comprises the three layers 201, 202, 203.

Figure 3:
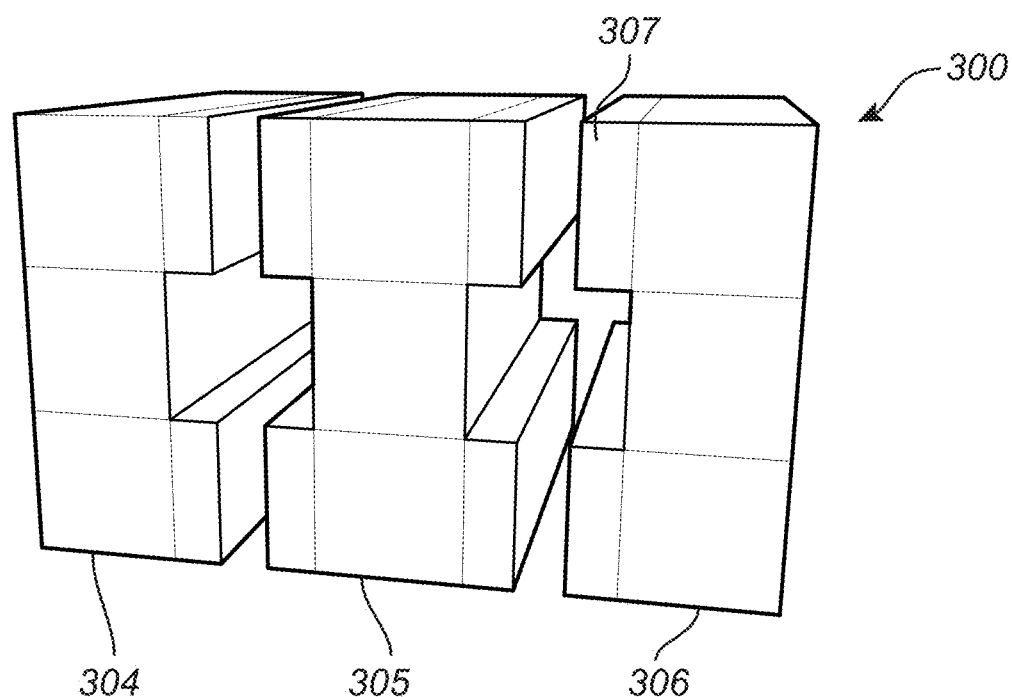

FIG. 3 shows a perspective view of multiple fin structures 300, which may be formed by further processing the fin structures similar to the fin structures 200 described above in reference to FIG. 2. As indicated in FIG. 3, a dielectric 307, e.g., an isolation dielectric, may be selectively formed on the sidewalls of the third 303 and the first layer 301. The dielectric 307 may thus form an electric isolation of the sidewalls of first and third layers of the fin, while leaving the sidewall of the second layer uncovered so as to allow the second layer to be contacted by a gate layer.

There are different techniques for selectively forming the dielectric 307 on the sidewall of the fins 304, 305, 306. A method according to an example comprises selectively oxidizing the first layer 301, the second layer 302 and the third layer 303 at a temperature and pressure selected such that the thickness of the dielectric is growing faster on the first 301 and third layer 303 than on the second layer 302. In this way a thicker dielectric layer, e.g., isolation dielectrics, may be formed on the first and third layer, and a relatively thin dielectric layer, e.g., a sacrificial dielectric, or no dielectric at all, formed on the sidewall(s) of the second layer. The dielectric may then be etched to expose the sidewall of the second layer. A uniform etch of the dielectric may result in the dielectric being completely removed from the second layer, whereas at least some of the dielectric remains on the first and third layer.

Figure 10:
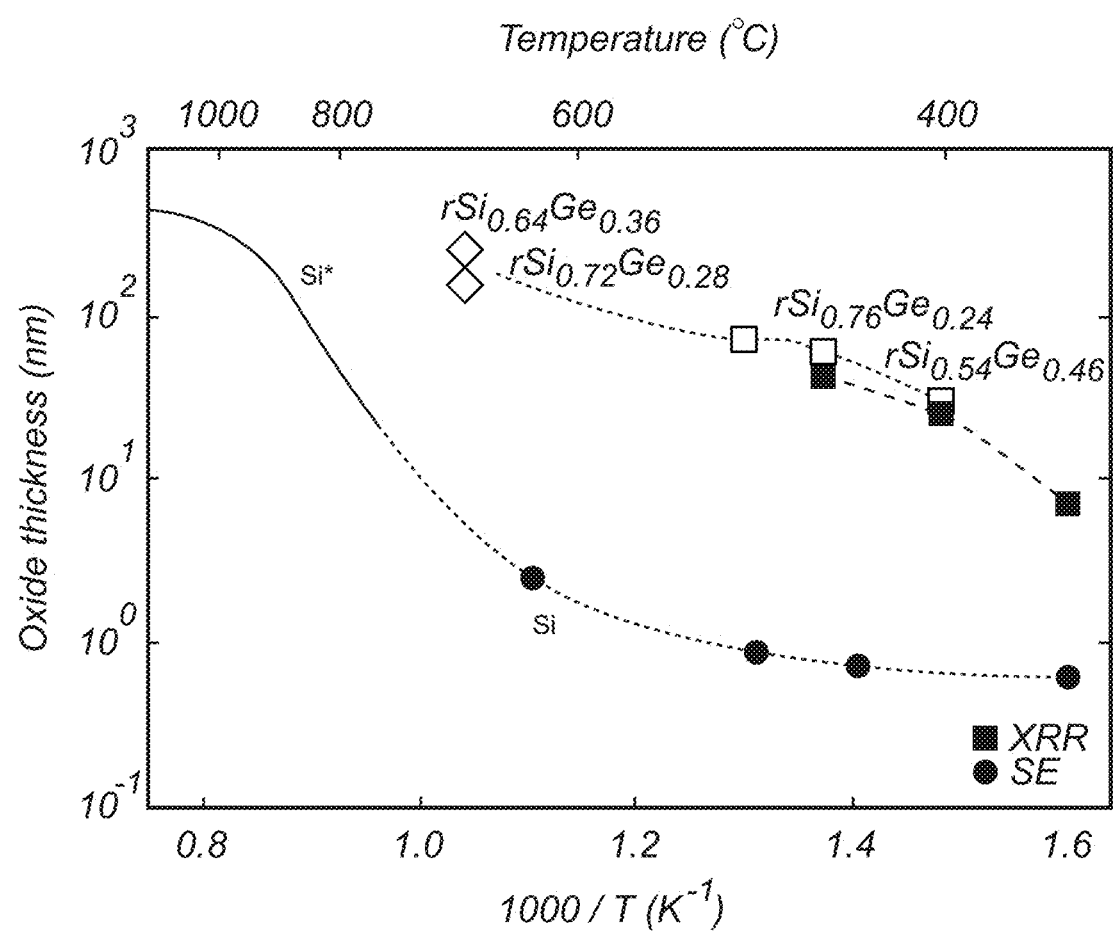
FIG. 10 is a diagram showing oxide growth on different materials as a function of temperature.

FIG. 10 is a diagram showing an example of how the materials forming the first, second and third layers may affect how the oxide (dielectric) grows to different oxide thicknesses at different temperatures. In the specific example, the oxide growth on Si and SiGe is shown. The oxide thickness is represented by the vertical y-axis and the temperature by horizontal x-axis. As indicated in FIG. 10, SiGe may oxidize at much higher rates than Si, and in particular at temperatures between 400° C. and 700° C. The selective deposition of the dielectric may therefore be realized by oxidizing first and third layers of SiGe and a second layer of Si at such a temperature interval, followed by a step of removing the oxide from the Si layer to allow the gate electrode to contact the channel region of the transistor device.

Alternatively, or additionally, the selective forming of the dielectric may be achieved by functionalizing (or preparing) the surface of the layers in a manner that allows for the dielectric, such as, e.g., an oxide, to deposit faster on sidewall surface(s) of the first and third layers and slower on the sidewall surface(s) of the second layer. One option may be to use atomic layer deposition (ALD), which may enhance deposition on the sidewall surfaces of the first and third layers, while another option may be to use ALD or chemical vapor deposition (CVD) to inhibit nucleation of the sidewall surface of the second layer. Further, hydrophilic —H bonds and hydrophobic —O—H bonds may be used to achieve a selectivity in the forming of the dielectric.

Figure 4:
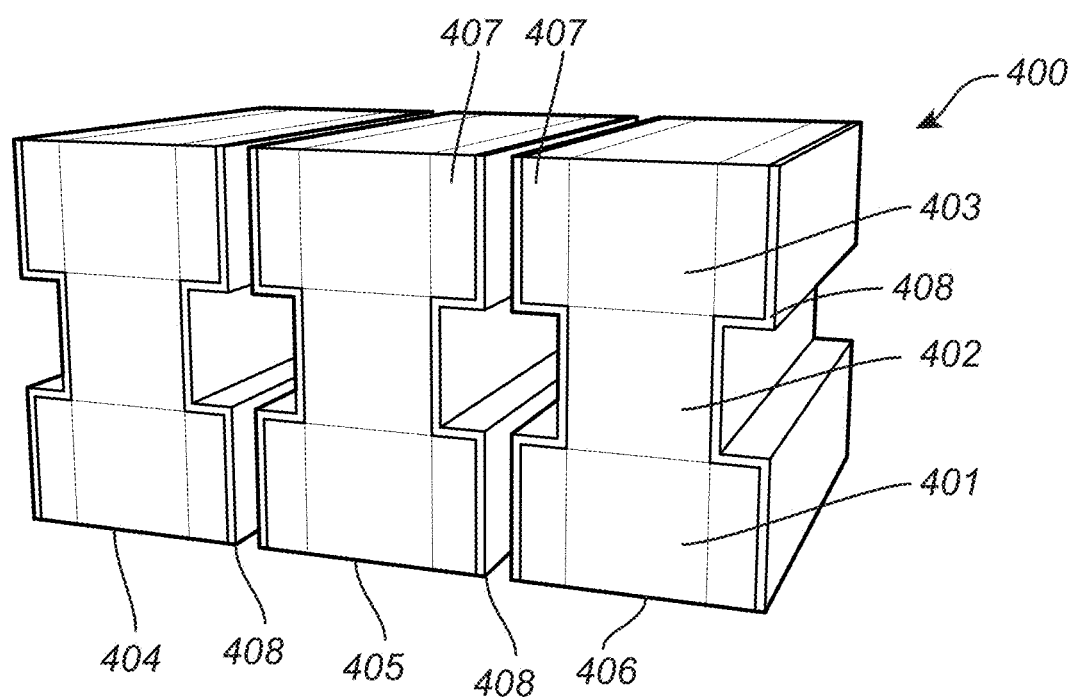

FIG. 4 shows a perspective view of the fin structures 400, which may be formed by further processing fin structures similar to the fin structures described with reference to FIG. 3. As indicated in FIG. 4, a gate oxide or gate oxide stack 408 may be formed on the sidewall of the first layer 401, second layer 402 and third layer 403. In this way, the second layer 402 may define a vertical channel region of a FET. The gate oxide stack 408 may be different to the dielectric previously formed on the first and third layer, and may in some examples comprise a high-k material such as, e.g., $SiO_2$.

Figure 5:
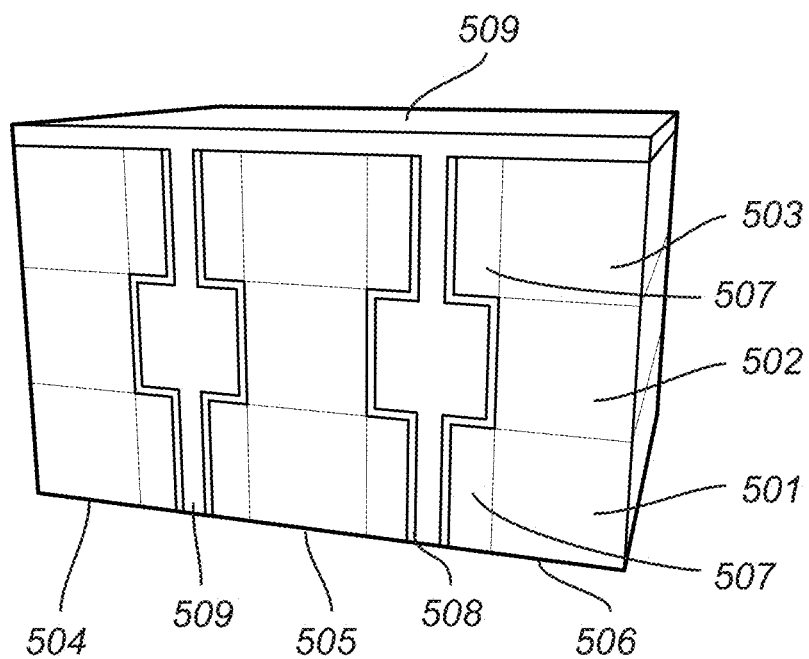
FIG. 5 is a perspective view of the fins formed using the method illustrated with respect to FIGS. 1-4, and further comprising a gate layer.

FIG. 5 shows a perspective view of fin structures 500, which may be formed by further processing fin structures similar to those described with reference to FIG. 4. The fin structure 500 may further comprise a gate layer 509, which may be formed on the vertical sidewall(s) of the fins 504, 505, 506 and above the fins 504, 505, 506. The material may in some examples be added to completely fill the space between adjacent fins 504, 505, 506. According to the present embodiment, the gate layer 509 may serve at least two different purposes, namely to provide a gate electrode (or gate replacement electrode) of the transistors to be formed of the fin, and to provide an etch mask to be used when forming the fin into pillars. Due to the dielectric 507 that has been selectively formed on the sidewalls of the first and third layers 501, 503, the gate electrode, formed by the gate layer 509 contacting the channel region 502, may be vertically aligned between the dielectric 507 on the sidewalls of the first layer 501 and the third layer 503. Thus, the channel region may be self-aligned in the vertical direction of the fin. It should however be noted that the term "contacting" not necessarily is limited to Ohmic contact. Instead, the contact may be realized by means of an electric field acting on the channel region through, e.g., a gate oxide stack arranged between the gate electrode and the channel region.

Figure 6A:
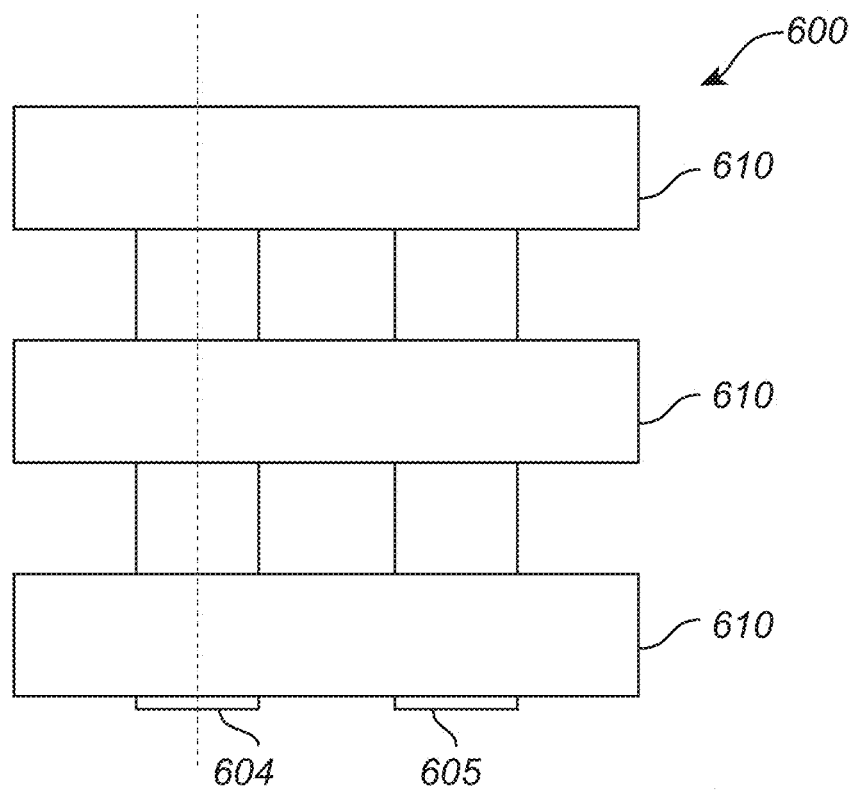
FIGS. 6a and 7a are top-down plan views of an etch mask formed above the fins according to an embodiment.
Figure 6B:
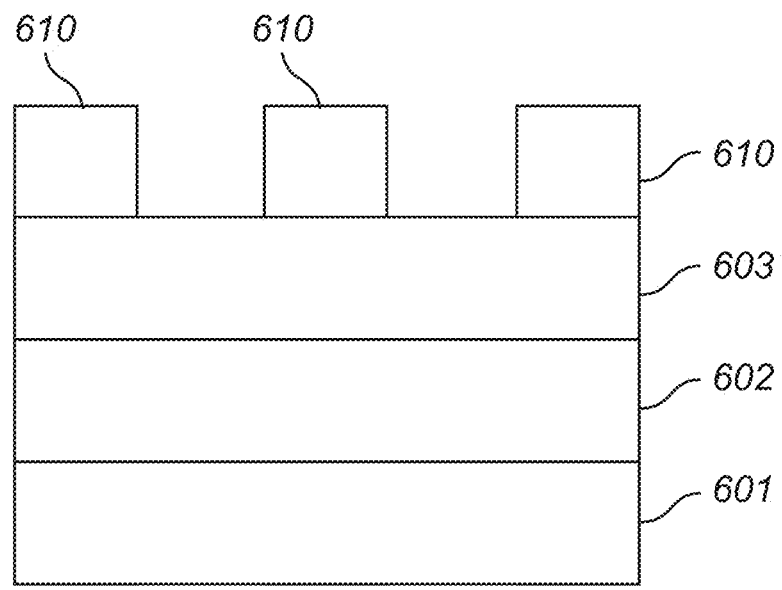

FIGS. 6a and 6b show top-down planar and side views a pair of fins 604, 605 that may be similarly configured as the ones disclosed above in connection with FIGS. 1-5, wherein the gate layer on top of the fin structure 600 has been patterned into three parallel gate lines 610. The gate lines 610 may, e.g., be formed by an anisotropic etching of the gate layer, such that a pattern of mask lines extending orthogonal to the fins 604, 605 is achieved as indicated in the top view of FIG. 6a. The top part of the gate layer, arranged above the third layer 603 of the fins 604, 605, may thus form an etch mask, whereas the part of the gate layer arranged along the sidewalls of the fins 604, 605 may form the gate electrode for contacting the channel region of the transistor devices formed by the fins 604, 605. In FIG. 6b, a cross section of a first one of the fins 604, taken along the dotted line in FIG. 6a, is shown, illustrating the etch mask portions 610 formed by the gate layer.

Figure 7A:
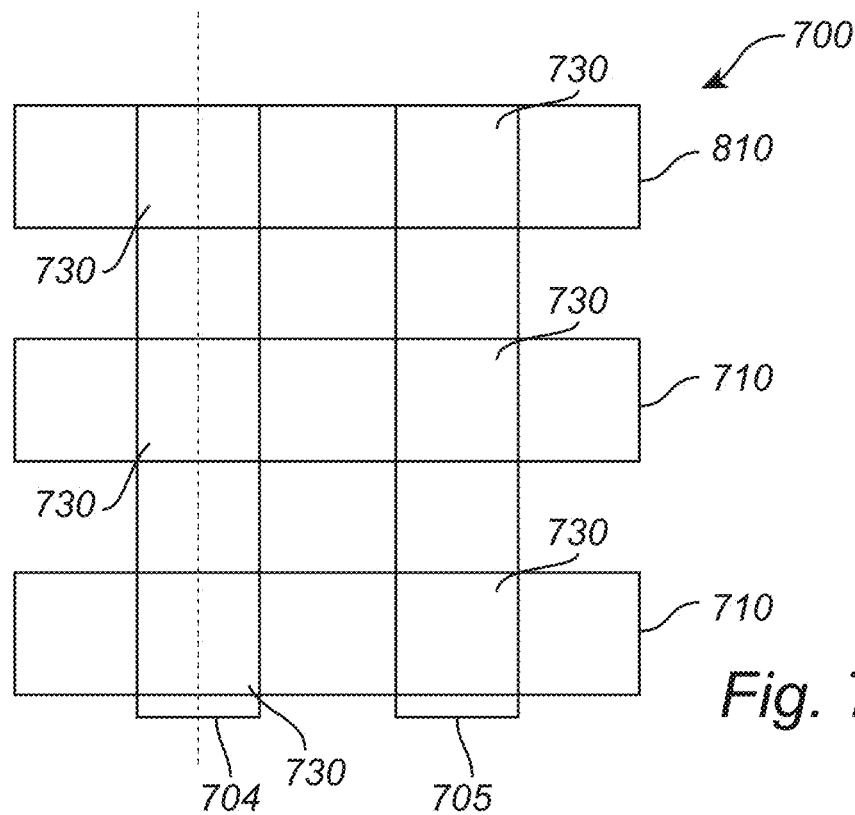
Figure 7B:
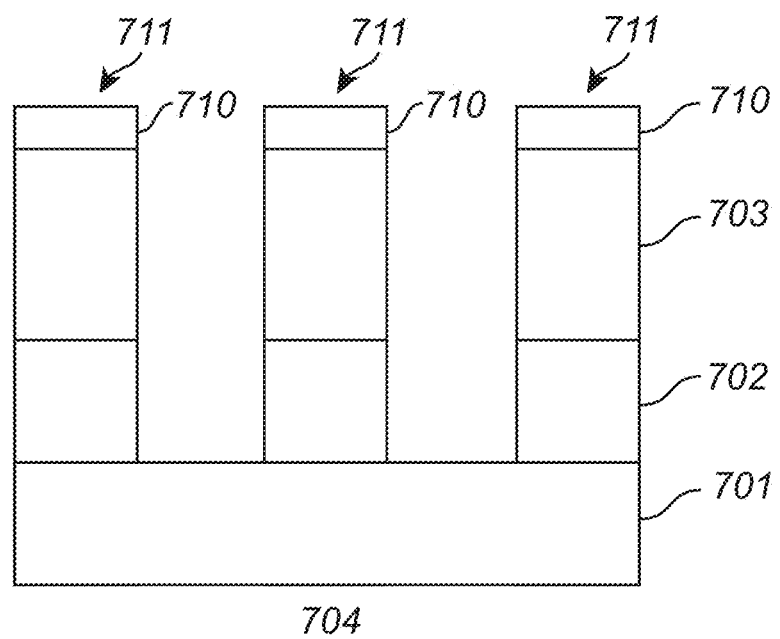

FIGS. 7a and 7b show a similar top view and cross section, respectively, as in FIGS. 6a and 6b, wherein each of the fins 704, 705 has been etched to form three pillars 711. Thus, the size and location of the pillars 711 may be defined by the intersection between the fins 704, 705 and the gate lines 710. As indicated in the present figure, the etching may stop on the first layer 701 of the fins 704, 705. The first layer 701 may therefore be a common layer or common drain to all vertical transistor devices of the same fin 704, 705.

Alternatively, the first layer 701 may be etched as well to separate the transistor devices from each other. This step may be followed by a re-growth of a layer between the pillars, preferably of a doped material, forming a bottom electrode connecting the source/drain regions of the transistor devices.

Figure 8:
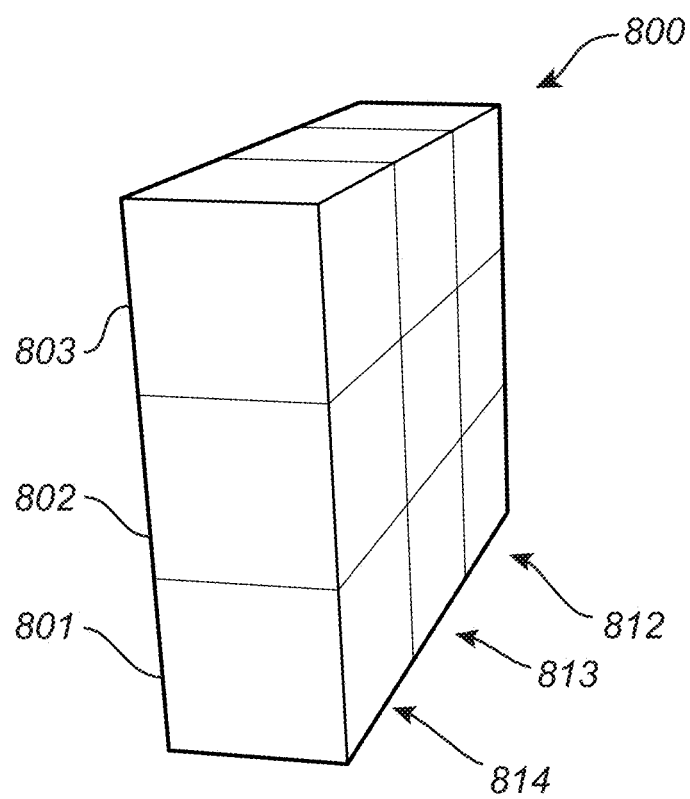
FIG. 8 is a perspective view of a fin, comprising differently doped vertical regions, according to an embodiment.

In order to form different types of transistor devices, such as, e.g., N-type and P-type transistors, each fin may comprise vertical regions of different doping. An example of such regions 812, 813, 814 is illustrated in FIG. 8, which shows a perspective view of a fin 800 where the layers 801, 802, 803 have been formed by means of, e.g., epitaxial growth. In some embodiments, different regions of the fins may be doped in-situ during growth. For example, during the epitaxial growth, impurities may be added to the material so as to form N and P doped regions of each layer. In the first region 812 and the third region 814, the first and the third layer 801, 803 may be P-doped and the second layer N doped. The first region 812 and the third region 814 may therefore be formed into an N-type transistor, respectively. The second region 813 may comprise a first and a third layer 801, 803 that is N-doped, and a second layer 802 that is P-doped. Thereby a P-type transistor may be formed of the second region 813. The doping may, e.g., be performed separately for each layer and/or region, e.g., by adding impurities during epitaxial growth of the respective layer 801, 802, 803, and/or by implanting ions afterwards.

Further, each of the fins may have a transistor pair formed by a P-type and N-type transistor device and a remaining transistor device formed by a N-type or P-type transistor device. As an example, there may be formed one P-type transistor device and at least two N-type transistor devices of each fin, or at least two P-type transistor devices and at least one N-type transistor device of each fin.

The gate lines 810 may also be interrupted in between the fins such that the gate of the transistor devices in the first fin 804 are isolated from the gate of the transistor devices in the second fin 805. Since the source and the drain region are arranged above each other, the current may flow in the vertical direction and form a vertical transistor device. As the gate lines 810 may be arranged on both lateral sides of the fin 804, 805, the gate of the transistor device may be contacted from either side (or both sides) of the fin 804, 805.

The transistor devices of each fin may be interconnected to form a static random access memory, SRAM device. In one example six transistor devices of two fins may form a SRAM device. The SRAM device may include two N-type transistor devices and four P-type transistor devices or two P-type transistors and four N-type transistors. The SRAM device normally comprises pass-gate (PG) transistors, pull-down transistors (PD) and pull-up transistors (PU) formed of the N- and P-type transistor devices.

Figure 9:
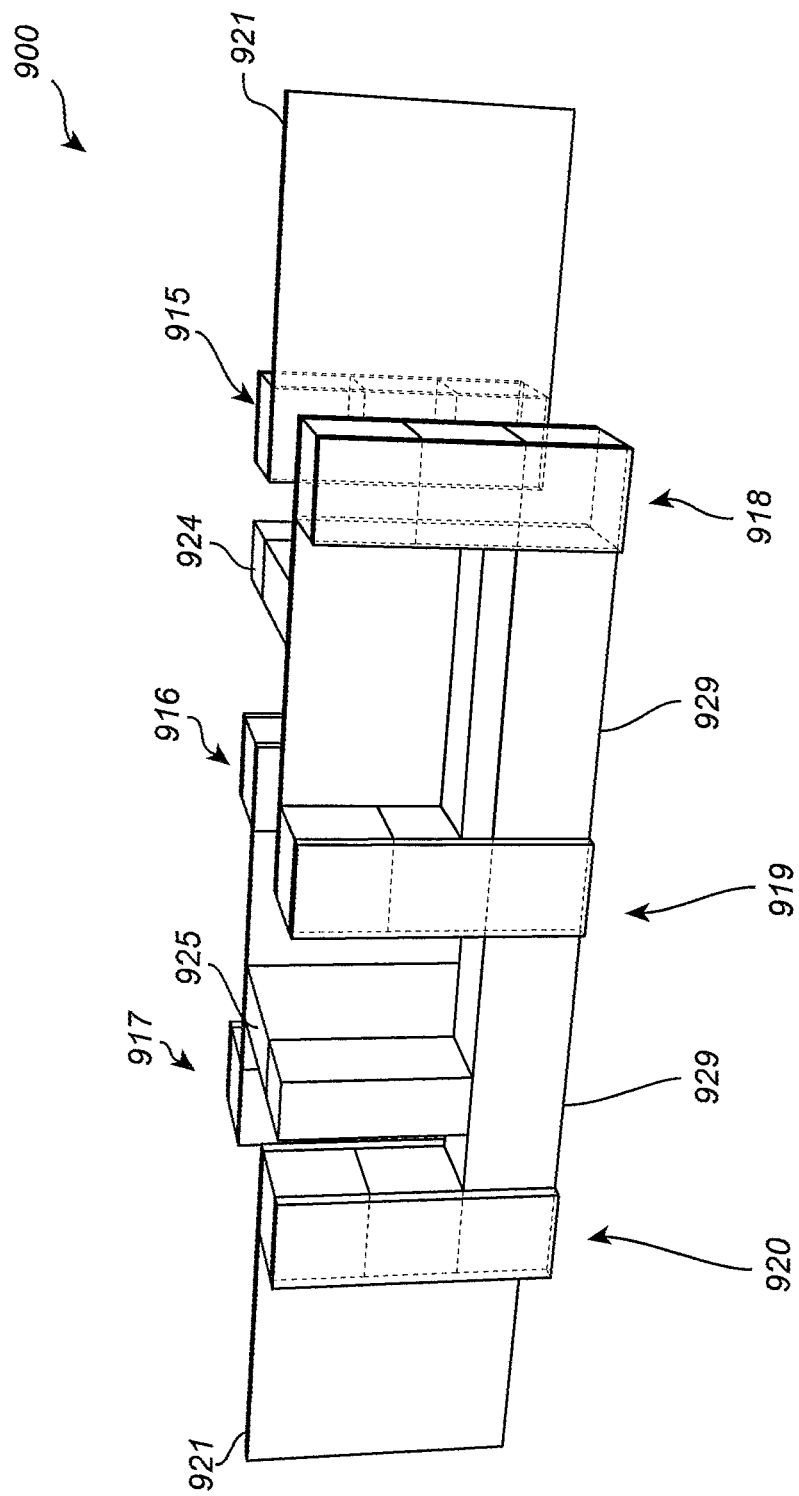
FIG. 9 shows an example of a SRAM device according to an embodiment.

FIG. 9 shows an example of a SRAM device 900 according to an embodiment. The SRAM device may be formed from two fins, i.e. a first fin and a second fin. The fins may be formed into six vertical transistor devices, i.e., a first 915, second 916 and third transistor device 917 of the first fin and a fourth 918, fifth 919 and sixth transistor device 920 of the second fin.

Each one of the three transistor devices of each fin may be connected to their neighbor transistor device within the fin by the drain connection formed by the first layer of that fin. The first layer may be silicided at the part forming the drain connection between two neighboring transistors.

The gates of the transistor pair of each fin may be electrically connected to each other and further electrically connected to the drain connection of the transistor pair in the other fin such that an SRAM cell 900 is formed. The electrical connections may be formed at least in the region between the two parallel fins, which allows for a relatively short interconnection between the transistor devices and hence an efficient area usage. Reducing the interconnection length further allows for a reduced capacitance and hence an increased speed of the SRAM cell.

The electrical connection to the drain connection may also extend beyond the region in between the two parallel fins. In some cases, the SRAM cell 900 may be contacted from a point outside the periphery of the cell, which facilitates connection to other fins or logic components.

The gates of the remaining transistor devices, for example the respective gate of the first transistor device 915 and the sixth transistor device 920, may be electrically connected to a wordline (WL) 921 which may be used for controlling access to a storage cell during read and write operations. The gate of the sixth transistor device 920 may also be electrically connected to a bitline (BL) and the gate of the first transistor device 915 may be electrically connected to an inverted bitline (iBL). The electrical interconnections may be formed at least in the region between the two parallel fins. The bitlines may be used to transfer data for both read and write operations of the memory cell. The gates of the second 916 and third transistors 917, may be electrically connected together by connection 925 and also electrically connected to the drain connection 929 of the transistor pair 920, 919 in the second fin. Thus, an SRAM cell may be provided in which the electrical connections may be formed at least in the region between the two parallel fins. In a similar way, the gates of the fourth 918 and fifth 919 transistor devices may be electrically connected together by connection 924 and also electrically connected to the drain connection (not shown) of the transistor pair 916, 915 in the first fin, so as to form a cross-coupled inverter pair.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A method of forming a vertical transistor device, the method comprising:
   forming, on a substrate, a fin comprising a stack including a first layer, a second layer formed above the first layer and a third layer formed above the second layer;
   forming a gate layer serving as an etch mask above the third layer; and
   etching the second and third layers of the fin using the gate layer as the etch mask to form a pillar,
   wherein first and third layers of the pillar define a source region and a drain region, respectively, of the vertical transistor device,
   wherein a second layer of the pillar defines a channel region of the vertical transistor device, and
   wherein the gate layer comprises a gate electrode arranged on at least one sidewall of the second layer.

2. The method according to claim 1, further comprising, after etching, forming a dielectric on sidewalls of the first and third layers of the fin selectively against the at least one sidewall of the second layer to electrically isolate the source and drain regions from the gate layer.

3. The method according to claim 2, wherein the dielectric is formed by:
   oxidizing to form initial dielectrics on the first, second and third layers at a temperature and pressure selected such that the initial dielectrics formed on the first and third layers are thicker than the initial dielectric formed on the second layer, and
   etching the initial dielectric to expose the sidewall of the second layer while leaving at least part of the initial dielectric remaining on the first and third layer.

4. The method according to claim 1, wherein the etch mask comprises a gate line extending in a direction crossing a direction in which the fin extends.

5. The method according claim 1, further comprising forming a plurality of parallel fins, wherein:
   the gate layer comprises at least three parallel gate lines, the gate lines being isolated from each other and extending in a direction crossing a direction in which the plurality of fins extend; and
   each of the plurality of fins comprises a first vertical region for forming an N-type transistor device, and a second vertical region for forming a P-type transistor device.

6. The method according to claim 5, comprising:
   forming a first transistor device, a second transistor device and a third transistor device as part of a first one of the fins; and
   forming a fourth transistor device, a fifth transistor device and a sixth transistor device as part of a second one of the fins,
   wherein each of the plurality of fins has a transistor pair comprising a P-type transistor device and an N-type transistor device.

7. The method according to claim 6, wherein the gate lines are interrupted between the fins to isolate a gate of the first to third transistors devices in the first fin from a gate of the fourth to sixth transistors devices in the second fin.

8. The method according to claim 6, wherein the transistor devices of each of the fins are connected to a neighboring transistor device by a drain connection formed by the first layer of the each of the fins.

9. The method according to claim 8, further comprising siliciding a portion of the first layer of each fin to form the drain connection between two neighboring transistor devices.

10. The method according to claim 8, further comprising electrically connecting gates of the transistor pair of each of the plurality of fins and electrically connecting the gates to the drain connection of a transistor pair in another one the plurality of fins, thereby forming a static random access memory (SRAM) cell wherein the electrical connections are formed at least in the region between the two parallel fins.

11. The method according to claim 10, wherein the electrical connection to the drain connection extends beyond a region in between the two parallel fins.

12. The method according to claim 10, further comprising electrically connecting the gate of remaining transistors devices of each of the plurality of fins to a bit line and a word line, respectively, wherein the electrical connections are formed at least in the region between the two parallel fins.

13. The method according to claim 1, wherein the second layer is formed of silicon (Si) and the first layer and the third layer are formed of silicon-germanium (SiGe).

14. A method of fabricating a vertical transistor device, the method comprising:
   forming a plurality of fin structures extending in a first lateral direction, wherein adjacent fin structures are separated by a gap, and wherein each of the fin structures comprises upper and lower regions doped with a first dopant type that are vertically interposed by a middle region doped with a second dopant type;
   simultaneously forming a sacrificial dielectric on the middle region of the fin structures and isolation dielectrics on the upper and lower regions of the fin structures, wherein the sacrificial dielectric is thinner than the isolation dielectrics; and
   filling gaps between adjacent ones of the fin structures with a gate electrode material, wherein the gate electrode material extends outside of the gaps to form a gate layer covering upper surfaces of the fin structures.

15. The method according to claim 14, wherein the middle region of each of the fin structures has a different composition from the upper and lower regions of the each of the fin structures, and wherein simultaneously forming comprises thermally oxidizing at a temperature such that a thermal oxide is formed on the middle region of the each of the fin structures at a slower growth rate compared to thermal oxides formed on the upper and lower regions of the each of the fin structures.

16. The method according to claim 15, wherein the middle region of the each of the fin structures has a higher silicon content compared to upper and lower regions of the each of the fin structures.

17. The method according to claim 15, wherein simultaneously forming comprises thermally oxidizing at a temperature between 400° C. and 700° C.

18. The method according to claim 15, further comprising:
   patterning the gate electrode material covering the upper surfaces of the fin structures to form a gate line extending in a second lateral direction crossing the first lateral direction; and
   using the gate line as an etch mask to separate each of the fin structures into one more pillars, and to separate the gate material filling the gaps into gate electrodes corresponding to the one or more pillars.

19. The method according to claim 18, wherein separating each of the fin structures comprises etching at least the upper region and the middle region of each of the fin structures in a single etch step such that each of the one or more pillars comprises least a source or a drain and the gate electrode of the vertical transistor device.

* * * * *

UNITED STATES PATENT AND TRADEMARK OFFICE
CERTIFICATE OF CORRECTION

PATENT NO. : 10,720,363 B2
APPLICATION NO. : 15/977381
DATED : July 21, 2020
INVENTOR(S) : Julien Ryckaert et al.

Page 1 of 1

It is certified that error appears in the above-identified patent and that said Letters Patent is hereby corrected as shown below:

In the Claims

In Column 11, Line 54, Claim 5, delete "according" and insert --according to--.

In Column 13, Line 18, Claim 19, delete "least" and insert --at least--.

Signed and Sealed this
Fifteenth Day of December, 2020

Andrei Iancu
*Director of the United States Patent and Trademark Office*